United States Patent
Brumm et al.

[11] Patent Number: 6,098,786
[45] Date of Patent: Aug. 8, 2000

[54] SLIPPABLE ROLLER CONVEYOR FOR A CLEANROOM

[75] Inventors: Christopher A. Brumm; Breton C. Ranc, both of Huntington; Brent R. Howard; Christopher L. Cramer, both of Ft. Wayne, all of Ind.

[73] Assignee: Shuttleworth, Inc., Huntington, Ind.

[21] Appl. No.: 09/165,515

[22] Filed: Oct. 2, 1998

Related U.S. Application Data

[60] Provisional application No. 60/061,106, Oct. 3, 1997.

[51] Int. Cl.$^7$ .................................................. B65G 45/22
[52] U.S. Cl. ........................ 198/495; 198/463.3; 198/580; 198/71.81
[58] Field of Search .............................. 198/463.3, 370.1, 198/495, 580, 780, 781.09, 781.1; 454/187

[56] References Cited

U.S. PATENT DOCUMENTS

| | | |
|---|---|---|
| D. 295,567 | 5/1988 | Cooper et al. . |
| 3,240,315 | 3/1966 | Dressler et al. ......................... 198/780 |
| 4,200,178 | 4/1980 | Gunti ..................................... 198/370.1 |
| 4,314,629 | 2/1982 | Shilander et al. ...................... 198/500 |
| 4,403,688 | 9/1983 | Livia et al. . |
| 4,406,360 | 9/1983 | Smith et al. . |
| 4,541,520 | 9/1985 | Greenlee .............................. 198/370.1 |
| 4,682,927 | 7/1987 | Southworth et al. . |
| 4,693,052 | 9/1987 | Rebmann et al. . |
| 4,821,866 | 4/1989 | Melgaard . |
| 4,877,123 | 10/1989 | Fukuwatari et al. . |
| 5,038,923 | 8/1991 | Evans ..................................... 198/781 |
| 5,090,558 | 2/1992 | Hatouchi . |
| 5,242,046 | 9/1993 | Bailey . |
| 5,320,214 | 6/1994 | Kordis . |
| 5,341,918 | 8/1994 | Covert . |
| 5,429,642 | 7/1995 | Ohkuma . |
| 5,452,801 | 9/1995 | Horn . |
| 5,636,724 | 6/1997 | Scheler et al. . |

FOREIGN PATENT DOCUMENTS

| | | |
|---|---|---|
| 2-100919 | 4/1990 | Japan . |
| 3-51709 | 12/1993 | Japan . |
| 5-338748 | 12/1993 | Japan . |
| 08301439 | 11/1996 | Japan . |
| 9-52607 | of 1997 | Japan . |

*Primary Examiner*—Joseph E. Valenza
*Attorney, Agent, or Firm*—Woodard, Emhardt, Naughton, Moriarty & McNett

[57] ABSTRACT

A slippable roller conveyor for a class one cleanroom. In one embodiment, the present invention includes a slippable roller conveyor with a surface path for conveying objects that is largely open so as to facilitate the downward flow of air from a clean air source above the conveyor to an evacuator below the conveyor. The slippable rollers include guiding flanges to resist lateral movement of the object being conveyed. The conveyor includes skirts with substantially smooth surfaces and minimal horizontal surfaces that assist in discouraging lateral flow of the clean air. Also, one embodiment of the invention includes a powered transfer mechanism for transferring objects from one conveyor path to another conveyor path. The transfer mechanism is enclosed and evacuated so as to prevent the escape of particulate matter into the cleanroom. The driving mechanism, motor, and electrical components are also contained in evacuated enclosures.

13 Claims, 5 Drawing Sheets

SLIPPABLE ROLLER CONVEYOR FOR A CLEANROOM

This application claimes benefit of provisional application Ser. No. 60/061,106 filed Oct. 3, 1997.

BACKGROUND OF THE INVENTION

The present invention relates to powered conveyors suitable for use in a cleanroom, especially conveyors with slippable rollers used in a class 1 cleanroom.

In order to bring down the cost of various electronic components such as hard disks and integrated circuits, it is often necessary to automate the handling of these components during manufacturing. Since a large portion of the manufacturing costs of these components are incurred in cleanrooms, the automation of material handling within the cleanroom can significantly reduce the cost of the component.

One significant way to automate material handling in a cleanroom is by use of a powered conveyor with slippable rollers. Conveyors with slippable rollers have long been considered an especially good way to move material, especially material that must be handled smoothly. The slippable rollers of such conveyors provide a driving force that is proportional to the weight of the object being conveyed, yet do not slide against the surface of the object being conveyed if its motion is impeded. Instead, slippage occurs at the interface of the slippable roller and the roller shaft.

However, such conveyors may not be useful in a class 1 cleanroom because of the particulate matter that they may add to the cleanroom. For example, the slippable interface between the roller shaft and the slippable roller may generate particulate matter, a situation which is exacerbated on those conveyors having large numbers of rollers on each roller shaft.

Further, the motor drive and roller shaft driving mechanisms may also generate particulate matter which escapes into the cleanroom. Likewise, a lift and transfer mechanism with rubbing surfaces may also generate particulate matter which escapes into the cleanroom.

Further, many conveyors are not configured for the internal aerodynamics of a class 1 cleanroom. Such cleanrooms typically have a source of clean air in the ceiling, and an evacuator for room air in the floor, resulting in a generally downward flow of air. It is important that the air flow generally downward and not laterally, and also laminarly and not turbulently. However, many conveyors are not compatible with these considerations. For example, those conveyors with numerous rollers on each roller shaft may obstruct a large portion of the flow area of the conveying surface, and thus prevent the smooth, downward flow of air past the rollers and roller shafts. Sometimes the motor and electrical component cabinets of the conveyor protrude excessively beneath the surface path of the conveyor, and thus disrupt the downward flow of air. Further, the sides of many conveyors are open, thus permitting excessive lateral flow of air. Some conveyors includes components with excessive horizontal surface areas, on which particulate matter may settle rather than being evacuated from the room. These horizontal surfaces and other external surfaces are sometimes equipped with protrusions that prevent easy cleaning of the surfaces by maintenance personnel.

What is needed is an apparatus that overcomes these disadvantages. The present invention does this in a novel and unobvious way.

SUMMARY OF THE INVENTION

In one aspect of the present invention there is an apparatus for conveying an object in a cleanroom, the cleanroom having a source of clean air generally above the apparatus and an evacuator generally below the apparatus for removing air from the cleanroom. The apparatus includes a conveying assembly with a path for conveying objects in a direction, the conveying assembly including a plurality of powered roller shafts. The conveying assembly also includes a plurality of slippable rollers driven by the roller shafts, each roller shaft including at least two slippable rollers rotatably coupled thereto. The conveying assembly has sides along the path, the sides being generally parallel to the direction of the path. The apparatus also includes a plurality of sideskirts extending downward from the sides of the conveying assembly. The sideskirts provide a flow path for clean air from the source that is generally downward through the path to the evacuator. The path has an area and the conveying assembly obstructs less than about 50% of the area from the downward flow of air.

In another aspect of the present invention, there is an apparatus for transferring objects on a conveyor in a cleanroom. The apparatus includes a first plurality of powered roller shafts, a second plurality of powered roller shafts, a transfer mechanism, and an enclosure for the transfer mechanism. The first plurality of powered roller shafts include at least two slippable rollers rotatably coupled thereto. The first roller shafts convey objects along a first path. The second plurality of powered roller shafts include at least two slippable rollers rotatably coupled thereto, the second roller shafts conveying objects along a second path different than the first path. The transfer mechanism transfers objects from the first path to the second path, the transfer mechanism including a pair of transfer belts for contacting the objects, the transfer mechanism lifting the objects. The enclosure for said transfer mechanism is evacuated to remove particulate matter located therein.

In another aspect of the present invention, there is a method for conveying objects within a cleanroom. The method includes providing a powered conveyor, the conveyor including a plurality of roller shafts and a plurality of slippable rollers for conveying objects, the rollers being driven by the roller shafts. The rollers provide a surface path along which the objects are conveyed. The surface path has an air flow area substantially open to facilitate the downward flow of clean air through the surface path. The method also includes conveying the objects by the rollers along the surface path. Further, the method includes enclosing the conveyor from about the height of the surface path to about the floor of the cleanroom, and restraining the movement of the objects in a direction lateral to the direction of motion by flanges on the rollers. The method also includes flowing clean air downward through the surface path and past the rollers.

In yet another aspect of the present invention, there is an apparatus for conveying an object along a path. The apparatus includes a plurality of rotatable roller shafts, each roller shaft driving at least two rollers rotatably coupled thereto. Each roller is capable of slipping relative to said roller shaft if the movement of the object is impeded. Each roller has a first diameter for supporting the object and a second diameter for resisting movement of the object in a direction lateral to the path. The first diameter is smaller than the second diameter. Each roller includes a conical surface, the conical surface being truncated with a small diameter and a large diameter, the small diameter of the conical surface connecting to the first diameter and the large diameter of the conical surface connecting to the second diameter.

These and other objects and advantages of the present invention will be apparent from the description of the preferred embodiment, the drawings, and the claims to follow.

BRIEF DESCRIPTION OF THE DRAWINGS

FIG. 4b shows the slippable flanged roller of FIG. 4a as taken along line 4b—4b of FIG. 4a.

FIG. 4c is a perspective view of the roller of FIG. 4a.

DESCRIPTION OF THE PREFERRED EMBODIMENT

For the purposes of promoting an understanding of the principles of the invention, reference will now be made to the embodiments illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

The present invention relates to a powered conveyor with flanged slippable rollers that is suitable for a class 1 cleanroom environment. Such cleanrooms typically have a supply of clean air located above the conveyor, and an evacuator for removing air located generally below the conveying surface path. The evacuator in some cases is incorporated into the floor of the cleanroom, pulling room air through perforations in the floor.

In one embodiment, the present invention includes a plurality of roller shafts with minimal slippable rollers being driven thereby, and preferably only two slippable rollers per roller shaft. By utilizing few slippable rollers, the surface path defined by the rollers is largely open and not obstructing to the downward flow of air in the cleanroom. Further, the number of slippable interfaces are minimized, thus reducing the number of frictional sites at which particulate matter may be generated. In some embodiments, the present invention also includes flanges on the rollers to prevent the lateral movement of the object being conveyed. These flanges replace product guides commonly used along the edges of the surface path. By eliminating the product guides, the downward flow of air through the surface path is thereby facilitated, and less turbulence is created within the flowing air.

In another embodiment of the present invention, the conveyor includes sideskirts along the sides of the roller shaft driving mechanism and roller shaft support mechanism that extend from those mechanisms downwardly to a position proximate to the floor of the cleanroom. These sideskirts minimize the lateral flow of air within the cleanroom near the conveyor. Particulate matter is thus encouraged to exit through the evacuated floor and not settle out within the cleanroom. The sideskirts are preferably smooth, with flush-mounted latches for their removal and thereby easy to wipe off by maintenance personnel. On those conveyors with ends, such as a linear portion of conveyor, endskirts are preferably incorporated in a manner similar to the sideskirts. It is desirable to enclose all sides and ends of the conveyor so as to minimize turbulence within the room, minimize lateral flow, and facilitate the removal of particulate matter by the evacuator.

In another embodiment of the present invention, the conveyor includes a lift and transfer mechanism for moving the conveyed objects from one surface path to a different surface path. The motor driven transfer mechanism is lifted by a pair of pneumatic cylinders. As the conveyed objects move onto the transferred belts of the transfer mechanism, the mechanism and object are lifted by the cylinders. The transfer belts then move the object from a first conveying surface path to a second conveying surface path. When located above the second conveying surface path, the pneumatic cylinders retract and the transfer mechanism and object are lowered so as to place the object onto the second conveying surface path. The transfer mechanism includes several pulleys and belts which may generate particulate matter potentially harmful to the objects being conveyed. However, the lift and transfer mechanism is located within an enclosure that is maintained at an internal air pressure lower than ambient air pressure. In this manner, particulate matter generated by the mechanism is contained within the enclosure and ultimately evacuated from the room.

This application incorporates by reference U.S. provisional patent application serial No. 60/061,106, filed Oct. 3, 1997; and U.S. patent application Ser. No. 08/866,723, filed May 30, 1997; all assigned to Shuttleworth, Inc.

Figure 1:
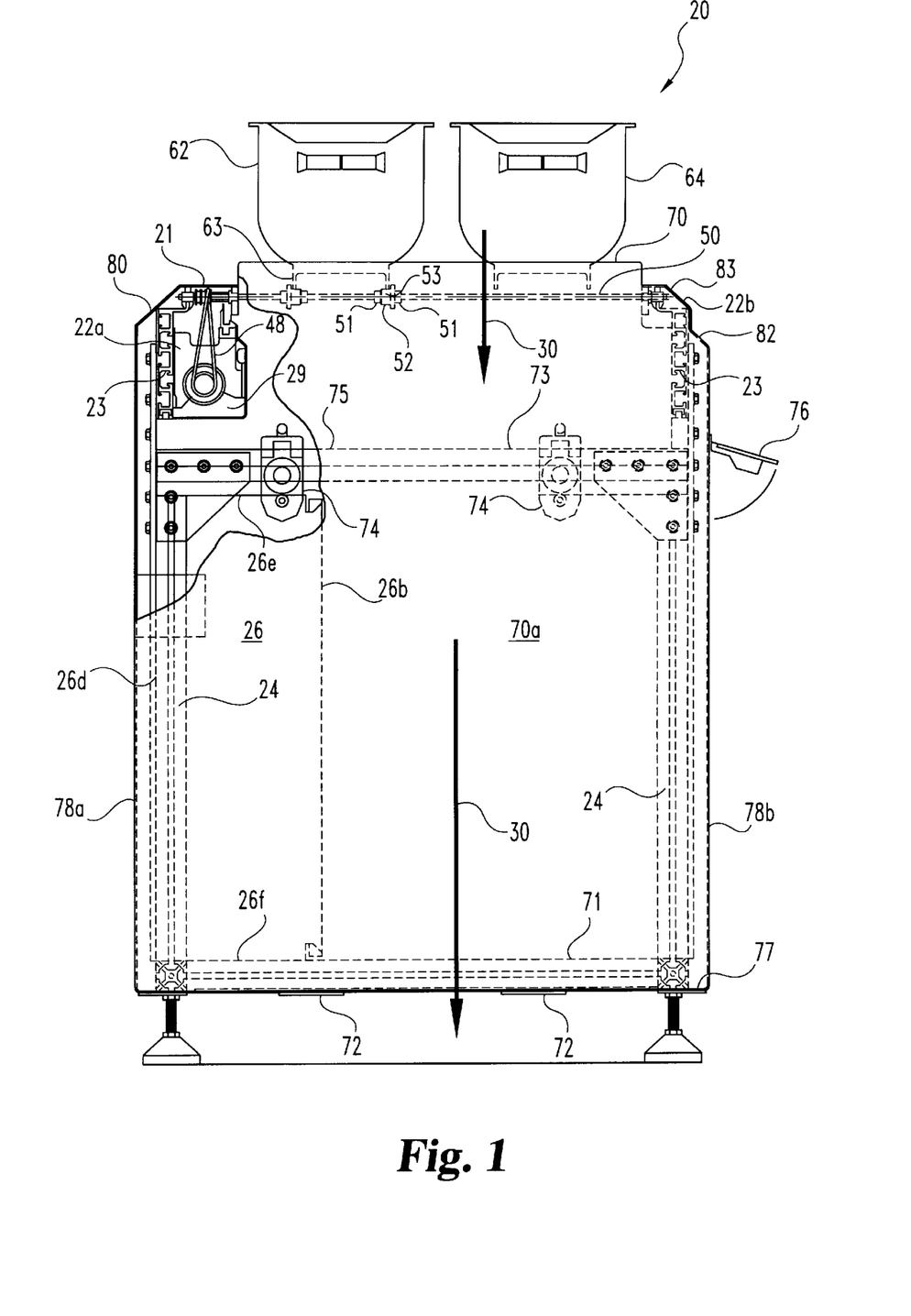
FIG. 1 shows an elevational end view of one embodiment of the present invention with portions of the endskirt removed for clarity.

FIG. 1 shows an elevational end view of apparatus 20, the first embodiment of the present invention. Apparatus 20 includes conveying assembly 21, which is supported by siderails 23 above the floor of the cleanroom, preferably by legs 24. Conveying assembly 21 includes roller shaft driving assembly 22a along one side of apparatus 20 and roller shaft support assembly 22b along the other side of apparatus 20.

Legs 24 also support electrical enclosure 26. Electrical enclosure 26 incorporates various junction boxes, conduit, cabling, and sensors (not shown) within a volume defined by side panels 26a and 26c, rear panel 26b, top panel 26e, bottom panel 26f, and door 26d. The various equipment located within electrical enclosure 26 is arranged to be relatively compact so that the overall enclosure provides minimal resistance to the downward flow of air as indicated by arrows 30. Preferably, enclosure 26 is not under the surface path of apparatus 20, so as to not interfere with the downward from of air. It is also within the contemplation of the present invention that some embodiments may include a means for evacuating air from within enclosure 26, so as to remove any particular matter therein and also to provide cooling for components located therein. The means for evacuating includes both connection of enclosure 26 to the clean room evacuator, and also connection to a separate evacuator pump.

Figure 2:
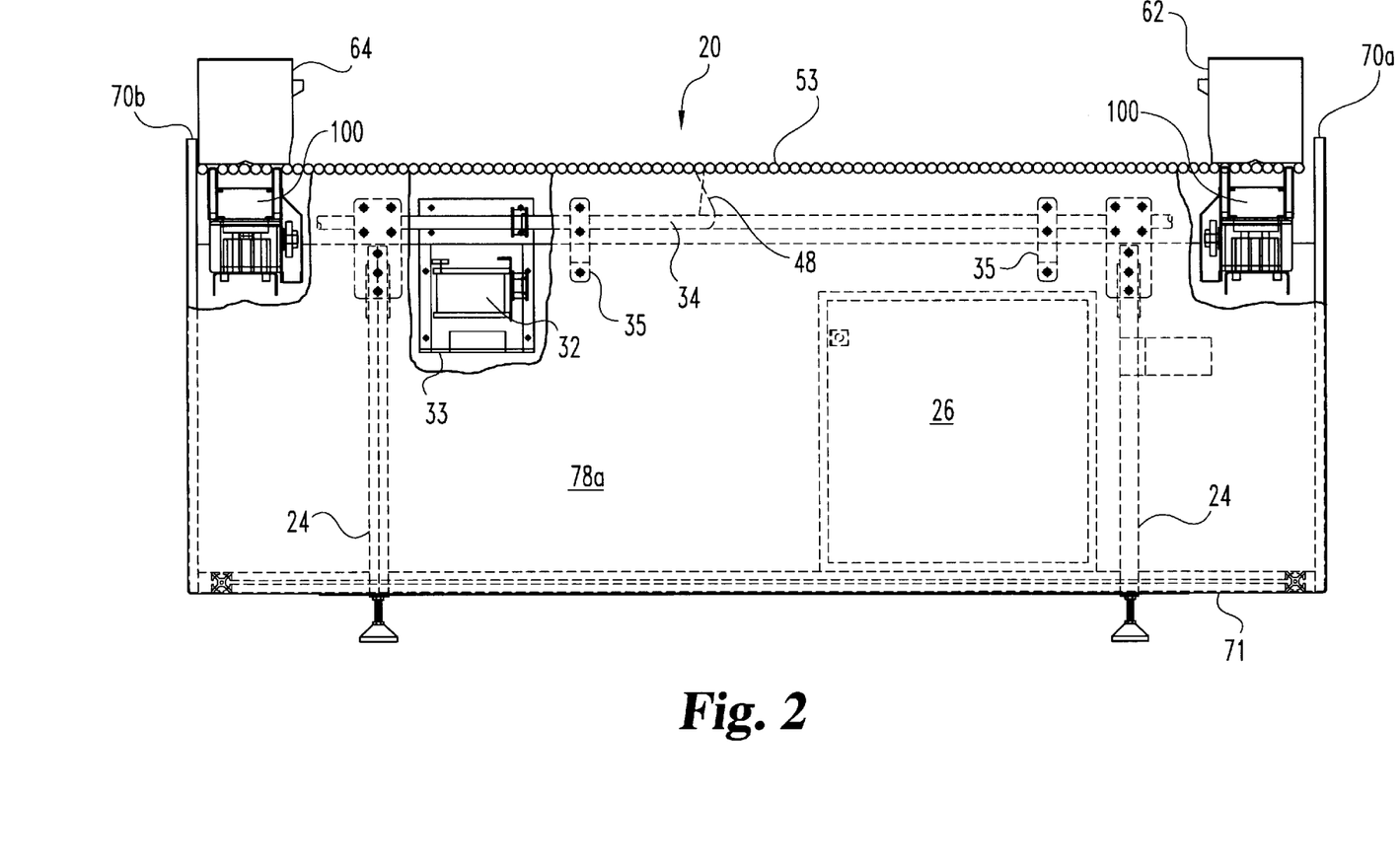
FIG. 2 shows an elevational schematic side view of one embodiment of the present invention, with portions of the sideskirts removed for clarity.

FIG. 2 shows an elevational schematic side view of the apparatus of FIG. 1, with portions of sideskirts removed for clarity, and including lift and transfer mechanisms 100 at both ends of apparatus 20. An electric motor 32 within evacuated enclosure 33 provides power to drive shaft 34 by means of a belt and pulley drive (not shown). Preferably, the enclosure 33 is placed underneath driving mechanism 22a and not under surface path 53. In this way enclosure 33 does not obstruct the downward flow of air through surface path 53. The present invention also contemplates other methods of power to shaft 34, including gear drive and chain drive.

A portion of shaft 34 is shown in FIG. 2 as supported by bearing assemblies 35. A plurality of drive belts 48 provide power from shaft 34 to roller shafts 50. Each roller shaft 50 is driven by an individual belt 48. Only a single belt 48 is shown in FIG. 2 for sake of clarity. In one embodiment of the present invention half of belts 48 are looped around shafts 50 in a first orientation, and the other half of belts 48 are looped around the remaining shafts 50 in an opposite orientation, with there being an alternating interspersal of the two orientations of loopings. In this manner rotation of drive shaft 34 causes half of shafts 50 to rotate in one direction, and the other half of shafts 50 to rotate in the opposite direction. The present invention also contemplates configurations of conveyor assembly 21 in which all shafts 50 are driven in the same direction.

Figure 3:
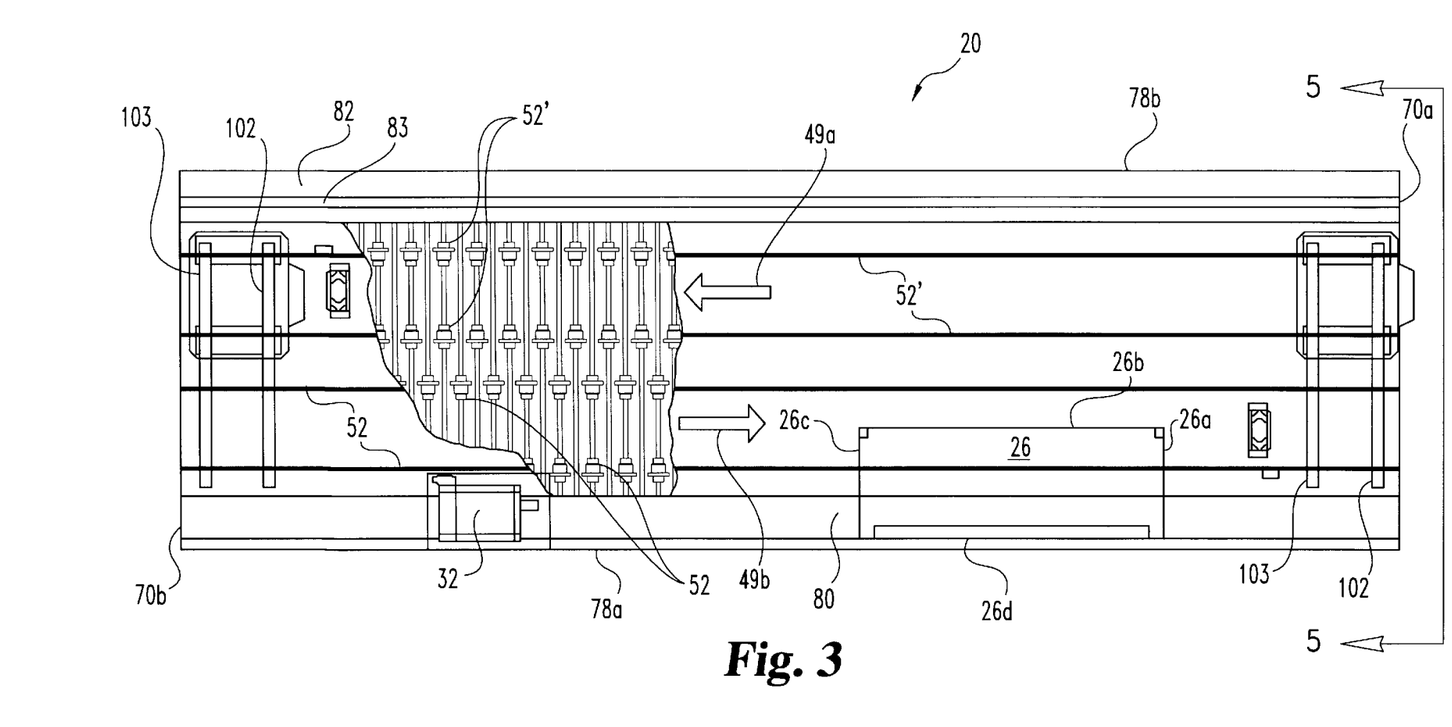
FIG. 3 shows a top schematic view of the apparatus of FIG. 2.

FIG. 3, which is a top schematic view of the apparatus of FIG. 2, shows a first set of flanged rollers 52 which convey objects in a first direction and first path indicated by arrow 49b, and a second set of flanged rollers 52' which convey objects in a second direction and second path indicated by arrow 49a. Although FIG. 3 is largely a schematic top view, a portion of the rollers 52 and 52' and shafts 50 are depicted. The present invention includes other embodiments in which all roller shafts 50 rotate in the same direction. In some of these other embodiments the second path may be co-linear and displaced from the first path, with the first and second directions being generally the same. The present invention also contemplates embodiments in which there are multiple paths or a single path, and multiple directions or a single direction.

In one embodiment of the present invention each roller shaft 50 includes two slippable flanged rollers 52, each roller 52 being located on shaft 50 between two collars 51. Collars 51 are fixed to shaft 50 so as to prevent lateral movement of roller 52. Flanged roller 52 is capable of rotating with shaft 50 or slipping relative to shaft 50.

Figure 4A:
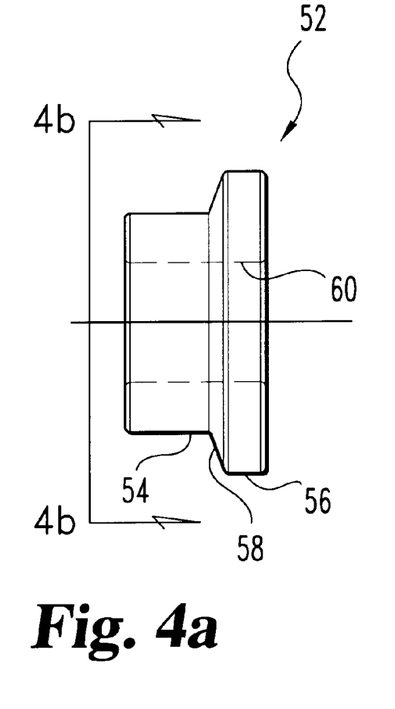
FIG. 4a shows a side elevational view of one embodiment of a slippable flanged roller of the present invention.
Figure 4B:
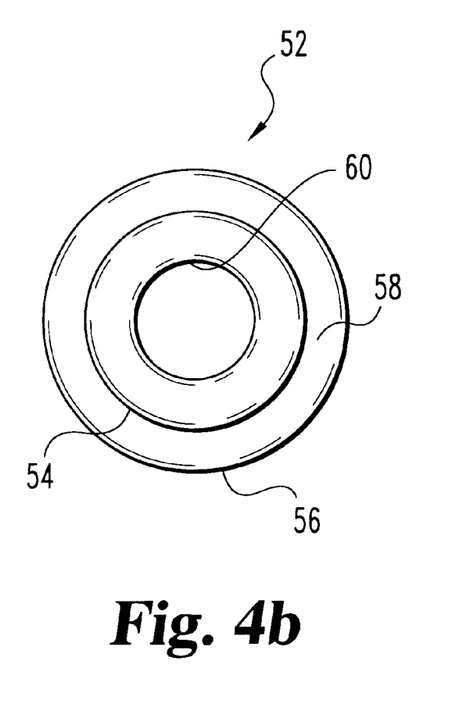
Figure 4C:
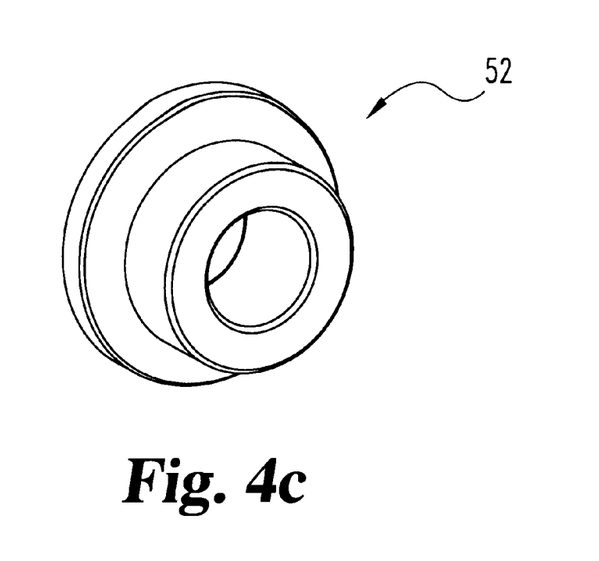

FIGS. 4a, 4b, and 4c show one embodiment of slippable flanged roller 52. Roller 52 includes a first outer diameter 54 useful for supporting a foot 63 of product container 62. The top surfaces of diameters 54 constitute conveying surface path 53. Roller 52 includes a flange 56 having a diameter greater than the diameter of surface 54. A truncated, conically shaped transition surface 58 extends from diameter 54 to diameter 56. Surface 58 is preferably angled from about 10 degrees to about 45 degrees. Feet 63 of container 62 are restrained from lateral movement by flanges 56. Rollers 52 are preferably cast or molded, but may also be machined.

Containers 62 and 64 are moved along surface path 53, which extends along the tops of rollers 52. These rollers are frictionally driven as described in U.S. Pat. No. 3,951,255 issued to J. Shuttleworth et al, and incorporated herein by reference. Rollers 52 have an inside diameter 60 that is larger than the outside diameter of roller shaft 50, thereby allowing rollers 52 to freely rotate on shaft 50. At least a portion of the inner diameter 60 contacts the outer surface of roller shaft 50, such that rotation of roller shaft 50 imparts rotation to rollers 52. Rotation of the rollers thereby conveys objects located along surface path 53. An increase in the downward pressure on rollers 52 results in the possible torque output of the rollers increasing. However, substantial resistance to movement along surface path 53 results in rollers 52 slipping on the roller shafts. Rollers 52 are thus individually rotatable and slippable upon roller shaft 50.

Some related art conveyors with slippable rollers include product guides that are attached to driving assembly 22a and support assembly 22b. These product guides extend inwardly along surface path 53 and restrain products being conveyed along surface path 53 from lateral movement. By incorporating flanges 56 on slippable flanged rollers 54, this embodiment of the present invention restrains lateral movement of a product being conveyed along path 53 without the use of separate product guides. Related art product guides partially block the downward flow of air through a conveyor. In comparison, flanges 58 provide restraints against lateral movement of a conveyed object, yet present little resistance to downward flow of air.

To further improve the downward flow of air through apparatus 20, another embodiment of the present invention contemplates a limited number of slippable flanged rollers on each roller shaft. As shown in FIG. 1, one embodiment of the present invention includes only two slippable flanged rollers 52 for each roller shaft 50. Each product container 62 is supported by diameters 54 of rollers 52 on one or more roller shafts 50. A second product container 64 is supported by slippable flanged rollers 52 on a roller shaft behind the shaft 50 shown in FIG. 1. The roller shafts of the present embodiment are driven such that product container 62 moves in a direction as depicted by arrow 49b of FIG. 3, whereas product container 64 moves in the direction indicated by arrow 49a.

By having preferably two slippable rollers 52 on roller shaft 50 and each roller 52 constrained by two collars 51, it is possible to have a surface path 53 that has a large projected area fraction of open air space and also presents minimal resistance to the downward flow of air. As air flows down and through surface path 53, the air flows around product containers 62 and 64, roller shafts 50, slippable flanged rollers 52, and collars 51. By incorporating a minimal number of rollers 52 on each drive shaft 50, the area presented for downward flow of air through path 53 is substantially the area between roller shafts 50. By minimizing the number of slippable flanged rollers 52 on each shaft 50, the flow impediment of the rollers 52 and collars 51 is likewise kept to a minimum. Further, by incorporating a flange 58 on each roller 52, it is possible to avoid the flow impediment of product guide mechanisms located along the edges of surface path 53.

By way of example only, one embodiment of the present includes a flanged roller 52 in which the first diameter is about 21 millimeters and has a width of about 12 millimeters, and the second diameter is about 32 millimeters and has a width of about 20 millimeters. The outer diameter of roller shaft 50 is about 8 millimeters. the width of surface path 53 from driving mechanism 22a to support assembly 22b is about 520 millimeters wide. Each roller shaft 50 includes two rollers 52 and two collars 51 for each roller, a collar being about 21 millimeters in diameter and about 12 millimeters wide. In this embodiment, the rollers have a projected area of about 1784 square millimeters, the collars have a projected area of about 1008 millimeters squared, and the roller shaft without rollers or collars has a projected area of about 4160 millimeters squared. The rollers, shaft, and collars occupy and obstruct about 36% of the possible flow area of the surface path, making the surface path about 64% open to the downward flow of air. The present invention also contemplates those embodiments in which the surface path is about 60% open to the downward flow of air, and less than about 40% obstructed.

Apparatus 20 preferably includes endskirts 70a and 70b located at ends of surface path 53. It is preferable that endskirts 70a and 70b span the width of apparatus 20 from driving mechanism 22a to support assembly 22b, and also span the height of apparatus 20 from a height near surface path 53 to bottom support rail 71 located near the floor of the clean room. It is also preferable that an endskirts 70a and 70b be located at each end of surface path 53. The lower end of endskirts 70a and 70b are supported along bottom rail 71 by guide pins 72. The upper portion of skirts 70a and 70b are retained on apparatus 20 by releasable latches 74 that are substantially flush-mounted and allow quick, easy, and repeatable fastening of skirts 70 to middle support 75.

Apparatus 20 also preferably includes various sideskirts 78a and 78b located along the length of conveyor 20, and generally extending from a height near surface path 53 to bottom rail 71. Each sideskirt 78a and 78b is attached to conveyor 20 by guide pins 77 located along bottom rail 71, and also by releasable, substantially flush-mounted latches 76 that cooperate with middle rail 73. The use of guide pins and releasable latches for skirts 70 and 78 is preferable, and permits quick removal of the skirts for cleaning of surfaces within apparatus 20. Latches 74 and 76 and pin mechanisms 72 and 77 are configured to present generally smooth surfaces with no or minimal protrusions that would snag a cleaning rag.

Sideskirts 78 and endskirts 70 cooperate to form a skirted enclosure around apparatus 20, generally covering the exterior sides of roller shaft driving assembly 22a and roller shaft support assembly 22b, as well as the exterior sides of legs 24 and other devices and structure under surface path 53. Skirts 78 and 70 may be fabricated from sheet metal, or may be extruded.

Skirts 70 and 78 are especially useful in a cleanroom environment where a source of clean air is located above surface path 53 and a means for evacuating room air is located at floor level. Skirts 70 and 78 define a flowpath for clean air from the room source through the interior of apparatus 20

Skirts 70 and 78 also resist lateral movement of air that has flowed downward past surface path 53. By impeding lateral flow, skirts 70 and 78 insure that particulate matter in the vicinity of containers 62 and 64 is more likely to flow downward to the evacuator, and less likely to flow to surfaces exterior to skirts 70 and 78.

Side skirts 78 preferably include features that both minimize the extent of horizontal surfaces on apparatus 20 and also aid in reducing air turbulence within the cleanroom around the exterior of apparatus 20. Referring to FIG. 1, driving mechanism 22a is shown enclosed by a side panel 78a that includes a single surface 80 which is angled approximately 45 degrees from the horizontal. Side skirt 78b encloses support mechanism 22b and incorporates two angled, generally coplanar surfaces 82 and 83, each of which are angled about 45 degrees from the horizontal. It has been observed that such angled surfaces tend to collect less particulate matter than horizontal surfaces. Further, angled surfaces 80, 82, and 83 create less turbulence in the downward flow of air within the cleanroom than would square corners or other shapes. Decreasing the turbulence in the flow of air external to apparatus 20 reduces the probability of the settling of particulate matter external to apparatus 20.

In some embodiments side skirts 78a and 78b are produced in multiple pieces, with the center of surface 80 or the area between surfaces 82 and 83 having the splitlines between the multiple pieces. Although surfaces 80, 82, and 83 have been described as being angled about 45 degrees from the horizontal, the present invention includes inclinations from about 30 degrees to about 60 degrees that are also useful for the smooth flow of air.

Figure 5:
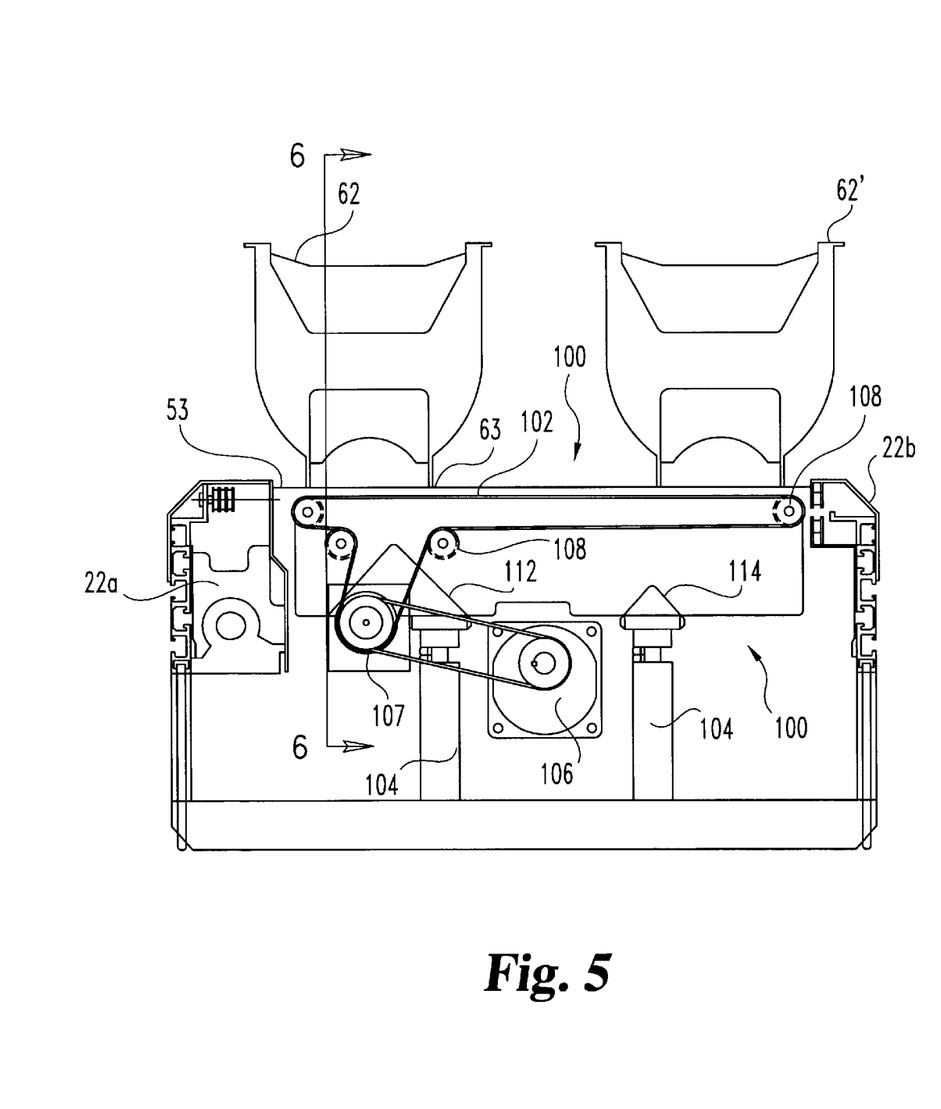
FIG. 5 shows an elevational side view of a lift and transfer mechanism of the present invention.
Figure 6:
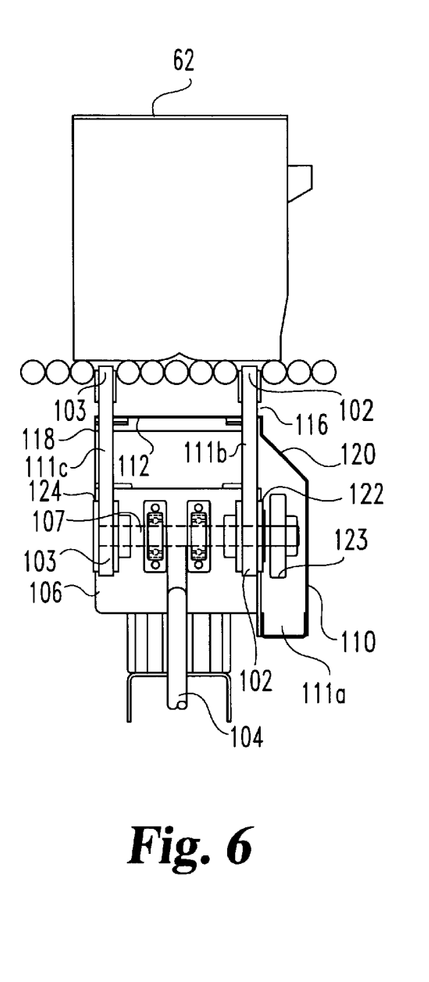
FIG. 6 is a view of the apparatus of FIG. 5 as taken along line 6—6 of FIG. 5.

FIG. 5 shows a lift and transfer apparatus 100 of another embodiment of the present invention for lifting and transferring a product or product container from a set of rollers moving in either direction 49a or 49b to a set of rollers moving in the opposite direction. Apparatus 100 includes belts 102 and 103 for lateral transfer of a product or product container. An object conveyed to the end of apparatus 20 stops in the position shown by container 62 over a pair of transfer belts 102 and 103. Apparatus 100, which includes belt drive mechanism 107, pulleys 108, motor 106, and belts 102 and 103, is then lifted by a pair of pneumatic cylinders 104, cylinders 104 being shown in the retracted position in FIG. 5. Cylinders 104 thus lift container 62 such that it is no longer in contact with slippable flanged rollers 52, and such that feet 63 are lifted above flanges 58.

Electric motor 106 provides power to driving mechanism 107, which includes a driven pulley 123 for providing power to transfer belt pulleys 122 and 124 by a shaft. Pulleys 122 and 124 drive transfer belts 102 and 103 over an array of pulleys 108. Motor 106 drives belts 102 and 103 to laterally transfer container 62 to the position shown for container 62'. When in position 62', cylinders 104 retract and the container is in contact with roller 52'.

Driving mechanism 107, including pulleys 108 and belts 102 and 103 driven thereby, and other moving parts are contained within enclosure 110. Transfer belts 102 and 103 are contained within enclosures 116 and 118, respectively. Enclosures 110, 116, and 118 are preferably sheet metal covers that surround the various components of the lift and transfer mechanism. These enclosures include within them evacuated volumes 111a, 111b, and 111c. A means for evacuation creates a slightly reduced air pressure within evacuated volumes 111, such that any particulate matter generated therein is removed from the room.

A portion of apparatus 100 between enclosures 116 and 118 and over the top of pneumatic cylinders 104 is covered by skirt 112 and skirt 114. Skirts 112 and 114 have a generally triangular cross section with a vertex of the triangular cross section pointed toward the downward flowing air. The upward orientation of the vertices of enclosures 112 and 114 reduces the turbulence in the air passing around apparatus 100, and also eliminates horizontal surfaces on which particulate matter could accumulate.

While the invention has been illustrated and described in detail in the drawings and foregoing description, the same is to be considered as illustrative and not restrictive in character, it being understood that only the preferred embodiments have been shown and described and that all changes and modifications that come within the spirit of the invention are desired to be protected.

What is claimed is:

1. An apparatus for conveying an object in a cleanroom, the cleanroom having a source of clean air generally above the apparatus and an evacuator generally below the apparatus for removing air from the cleanroom, comprising:

a conveying assembly with a path for conveying objects in a direction, said conveying assembly including a plurality of powered roller shafts, said conveying assembly including a plurality of slippable rollers driven by said roller shafts, each said roller shaft including at least two slippable rollers rotatably coupled thereto, said conveying assembly having sides along the path, the sides being generally parallel to the direction of the path; and a plurality of sideskirts extending downward from the sides of said conveying assembly, said sideskirts providing a flowpath for clean air from the source that is generally downward through the path to the evacuator;

wherein the path has an area, and said conveying assembly obstructs less than about forty percent of the area from the downward flow of air.

2. The apparatus of claim 1 wherein said slippable rollers have a first diameter for supporting the object and a second diameter for resisting movement of the object in a direction lateral to the path, said first diameter being smaller than said second diameter.

3. The apparatus of claim 2 wherein there are two said slippable rollers on each said roller shafts.

4. The apparatus of claim 1 which further comprises a motor for driving said roller shafts and an enclosure generally surrounding said motor, said enclosure having an internal air pressure that is less than the ambient air pressure of said cleanroom.

5. The apparatus of claim 1 wherein said sideskirts include flush mounted latches for coupling said sideskirts to said conveying assembly.

6. The apparatus of claim 1 wherein said conveying assembly has an end and which further comprises an endskirt extending downward from the end, said endskirt providing a flowpath for clean air from the source that is generally downward through the path to the evacuator.

7. An apparatus for transferring objects on a conveyor in a cleanroom, comprising:

a first plurality of powered roller shafts, said first roller shafts including at least two slippable rollers rotatably coupled thereto; said first roller shafts conveying objects along a first path;

a second plurality of powered roller shafts, said second roller shafts including at least two slippable rollers rotatably coupled thereto, said second roller shafts conveying objects along a second path different than the first path;

a transfer mechanism for transferring objects from the first path to the second path, said transfer mechanism including a pair of transfer belts for contacting the objects, said transfer mechanism lifting the objects; and an enclosure for said transfer mechanism, said enclosure being evacuated to remove particulate matter located therein.

8. The apparatus of claim 7 wherein said slippable rollers have a first diameter for supporting the object and a second diameter for resisting movement of the object in a direction lateral to the path, said first diameter being smaller than said second diameter.

9. The apparatus of claim 7 which further comprises a plurality of skirts extending downward from said first plurality of roller shafts, said skirts providing a flowpath for clean air from the source that is generally downward through the first path to the evacuator.

10. A method for conveying objects within a cleanroom having a downward flow of clean air, the method comprising:

providing a powered conveyor, the conveyor including a plurality of roller shafts and a plurality of slippable rollers for conveying objects, the rollers being driven by the roller shafts, the rollers providing a surface path along which the objects are conveyed, the surface path having an airflow area substantially open to facilitate the downward flow of air through the surface path;

conveying the objects by the rollers along the surface path;

enclosing the conveyor from about the height of the surface path to about the floor of the cleanroom; and restraining the movement of the objects in a direction lateral to the direction of motion by flanges on the rollers; and flowing clean air downward through the surface path and past the rollers.

11. An apparatus for conveying an object along a path, comprising:

a plurality of rotatable roller shafts, each said roller shaft driving at least two rollers rotatably coupled thereto, each said roller capable of slipping relative to said roller shaft if the movement of the object is impeded, each said roller having a first diameter for supporting the object and a second diameter for resisting movement of the object in a direction lateral to the path, said first diameter being smaller than said second diameter, each said roller including a conical surface, said conical surface being truncated with a small diameter and a large diameter, the small diameter of said conical surface connecting to said first diameter and the large diameter of said conical surface connecting to said second diameter.

12. The apparatus of claim 11 wherein there are only two said rollers per each said roller shaft.

13. The apparatus of claim 11 which further comprises a cleanroom, said cleanroom having a source of clean air generally above said roller shafts and an evacuator generally below said roller shafts for removing air from the cleanroom; and wherein the path has an area, and more than about forty percent of the area is open for the downward flow of air.

\* \* \* \* \*